US012341065B2

(12) United States Patent
Karpov et al.

(10) Patent No.: US 12,341,065 B2
(45) Date of Patent: Jun. 24, 2025

(54) DEPOSITION TOOL AND METHOD FOR FILLING DEEP TRENCHES

(71) Applicant: Intel Corporation, Santa Clara, CA (US)

(72) Inventors: Elijah V. Karpov, Portland, OR (US); Matthew Metz, Portland, OR (US); Robert Willoner, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 501 days.

(21) Appl. No.: 17/738,028

(22) Filed: May 6, 2022

(65) Prior Publication Data

US 2023/0360970 A1    Nov. 9, 2023

(51) Int. Cl.
*H01L 21/768*    (2006.01)
*H01J 37/32*    (2006.01)

(52) U.S. Cl.
CPC .. *H01L 21/76877* (2013.01); *H01J 37/32009* (2013.01); *H01J 2237/08* (2013.01); *H01J 2237/332* (2013.01)

(58) Field of Classification Search
CPC .................................................. H01L 21/76877
See application file for complete search history.

(56) References Cited

U.S. PATENT DOCUMENTS

| 5,525,158 | A | * | 6/1996 | Tsukazaki | ............... | C23C 14/46 |
|---|---|---|---|---|---|---|
| | | | | | | 118/723 VE |
| 2019/0027556 | A1 | * | 1/2019 | Shu | ..................... | H01L 21/3105 |
| 2021/0292889 | A1 | * | 9/2021 | Srinivasan | .............. | C23C 14/46 |
| 2023/0360970 | A1 | * | 11/2023 | Karpov | ............... | C23C 14/5833 |

FOREIGN PATENT DOCUMENTS

WO    2021188341 A1    9/2021

OTHER PUBLICATIONS

Sicong Sun, "Ion Beam Assisted Deposition of Biaxially-Textured Thin Films for Energy Applications", Partial fulfillment of the requirements for the degree of Doctor of Philosophy in Materials Science and Engineering, May 2020, 169 pages.
Frank Cerio et al, Abstract of conference publication, "Microstructural Optimization of Tungsten for Low Resistivity Using Ion Beam Deposition", 2021 IEEE International Interconnect Technology Conference (IITC), Jul. 9, 2021, IEEE.

* cited by examiner

*Primary Examiner* — William A Harriston
(74) *Attorney, Agent, or Firm* — Viering, Jentschura & Partner mbB

(57) ABSTRACT

The present disclosure is directed to semiconductor deposition tools having a specimen support, at least one ion gun directed to a specimen positioned on the specimen support, at least one source, and at least one electron beam gun directed at the source. In an aspect, the electron beam guns, sources, and ion beam guns are positioned below the specimen support and specimen positioned thereon, which has its top surface facing downward. In another aspect, the method includes activating the electron beam gun and depositing the source material in a trench in the specimen and on surfaces adjacent to the opening of the trench and activating the ion beam gun to remove portions of the source material deposited on the surfaces adjacent to the opening of the trench.

19 Claims, 8 Drawing Sheets

DEPOSITION TOOL AND METHOD FOR FILLING DEEP TRENCHES

BACKGROUND

In integrated circuit design and fabrication, trenches are commonly used structures in the various layers of a chip. Trenches may be used for separating or isolating devices, as well as for interconnects. For example, metal-filled trenches may be used as connectors to sources and gates of MOSFET devices. There are several conventional deposition processes for filling trenches, such as chemical vapor deposition (CVD), plasma vapor deposition (PVD), sputter deposition, etc.

As semiconductor devices continue to decrease in size, the device features with high aspect ratios are increasingly being used in both front-end and back-end silicon fabrication processes. The typical deposition processes and hardware used to provide material to fill cavities and trench in the device features with low aspect ratios and large pitches may not be effective for the high aspect structures, such as deep trenches. Accordingly, the deposition processes for semiconductor fabrication may benefit from additional techniques and tools for filling trenches with high aspect ratios.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 1 and 1A show a set of trenches that have been filled by a conventional deposition process;

DETAILED DESCRIPTION

Figure 1:
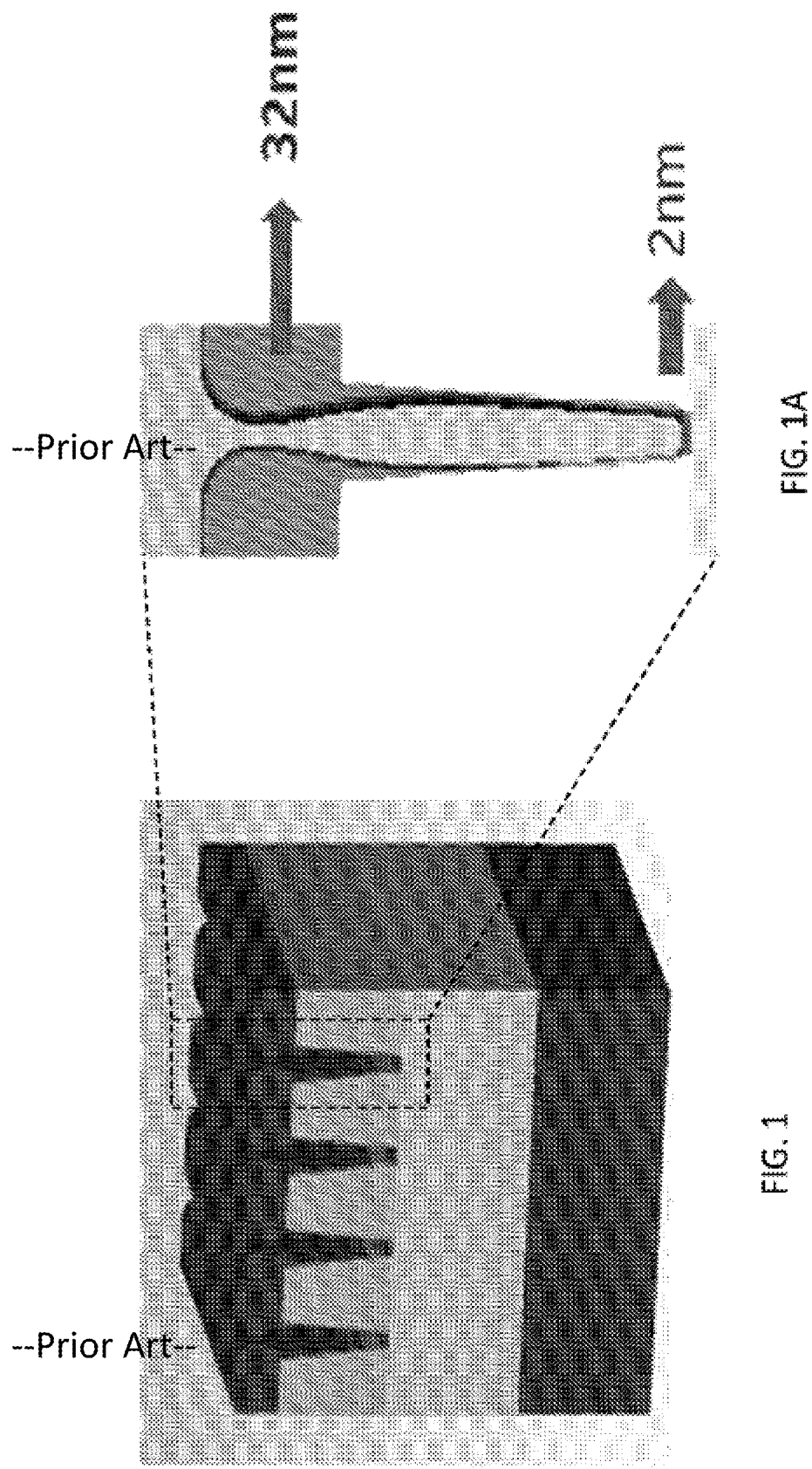

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to deposition technology for semiconductor processing, e.g., 300 mm wafer processing, that employs an electron beam evaporation from a source or target combined with the use of an ion beam gun, either simultaneous or in series, to remove obstructing source material that may prevent deposition at the desired location, e.g., a deep trench.

The technical advantages of the present disclosure include: 1) eliminating the "bread loafing effect" that commonly occurs with conventional deposition processes, 2) enabling the deposition of a thicker layer of source material at the bottoms of deep trenches, 3) minimizing damage to a surface during the depositing of the source material, and 4) reducing argon (Ar) contamination of the deposited layer of source material.

In an aspect, the present disclosure is directed to a semiconductor tool having a specimen support, at least one ion gun, wherein the ion gun is directed to a specimen positioned on the specimen support, at least one source, and at least one electron gun that is directed at the source. In this aspect, the electron gun, source, and ion gun are positioned below the specimen support and the specimen is positioned with its top surface facing downward.

In another aspect, the present disclosure is also directed to a semiconductor die with a trench having an aspect ratio that is greater than 2.5 and a trench-fill material filling the trench. The trench-fill material is deposited by electron beam deposition that is assisted by the removal of obstructions at an opening of the trench using one or more ion beams. The semiconductor die has trenches that have trench-fill material deposited at a bottom surface of the trench that is thicker than at sidewall surfaces of the trench.

In a further aspect, the present disclosure is further directed to a method that includes providing a specimen with a trench on an upper surface of the specimen. The trench has an opening, sidewall surfaces, and a bottom surface. In addition, this aspect includes providing at least one electron beam gun directed at a source to melt it and generate a flux/plasma of source material and at least one ion beam gun directed at the surfaces surrounding the opening of the trench. The electron beam gun is activated causing a flux/plasma of the source material to be formed and the deposition of the source material on the specimen, wherein the source material is deposited in the trench and on surfaces adjacent to the opening of the trench. Either simultaneously or in series, the ion beam gun is activated to remove at least portions of the source material deposited on the surfaces adjacent to the opening of the trench.

To more readily understand and put into practical effect, the present semiconductor deposition tools and methods, which may be used for filling deep trenches with metals, metal alloys, and other source materials, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIGS. 1 and 1A show a set of trenches that have been filled by a conventional deposition process, e.g., magnetron sputtering. Metal deposition processes using magnetron sputtering from metal targets have been commonly used to deposit blanket metal films, as well as to fill relatively low aspect ratio trenches with metals. However, there are three principal concerns with the use of magnetron sputtering.

First, as shown in FIG. 1A, the effect of "bread loafing", which may occur during sputtering deposition, will block access for the deposition of a sufficiently thick layer or film of metal at a bottom of a trench having a high aspect ratio (i.e., height vs. width that is greater than 2.5). This may result in insufficient thickness of the metal material at the bottom of the trench. Second, the sputtered atoms have a high energy level (5-10 eV) that may cause significant damage to the sidewall and bottom surfaces of a trench, which may impact the functionality of a device. Third, the sputtering process requires a working gas pressure in mTorr range and may result in argon (Ar) contamination of the interface and the deposited film.

As a significant drawback of conventional techniques, it is very difficult to deposit a sufficient amount of deposition material at the bottoms of the trenches because of bread loafing, which forms during deposition and results in the narrowing of trench openings and prevents the deposition material from reaching the bottom of the trenches. As shown in FIG. 1A, for example, typically only ~5% of deposition material reaches the bottom of the trench, i.e., 32 nm at a top surface, with only 2 nm deposited at a bottom of a trench.

According to the present disclosure, the present method/process may be able to deposit increased amounts of source material at a bottom of a trench because the process eliminates the bread loafing effect. The bread loafing effect may be eliminated because the process uses an ion beam to continuously remove material that may be blocking deposition into the trench, i.e., there is no blocking of the incoming atomic flux/plasma to the bottom of the trench. In addition, the present process is fundamentally different from conventional deposition processes; in particular, the atoms in the deposition flux have much lower energy at ~0.1 eV (>30x lower), than the energy of the sputtered atoms in a sputter PVD process at ~5 eV. Unlike sputtering, the present process will cause little to no damage to the substrate material, for example, a high-quality crystalline Si used for FinFET contact or other 2D material.

Figure 2:
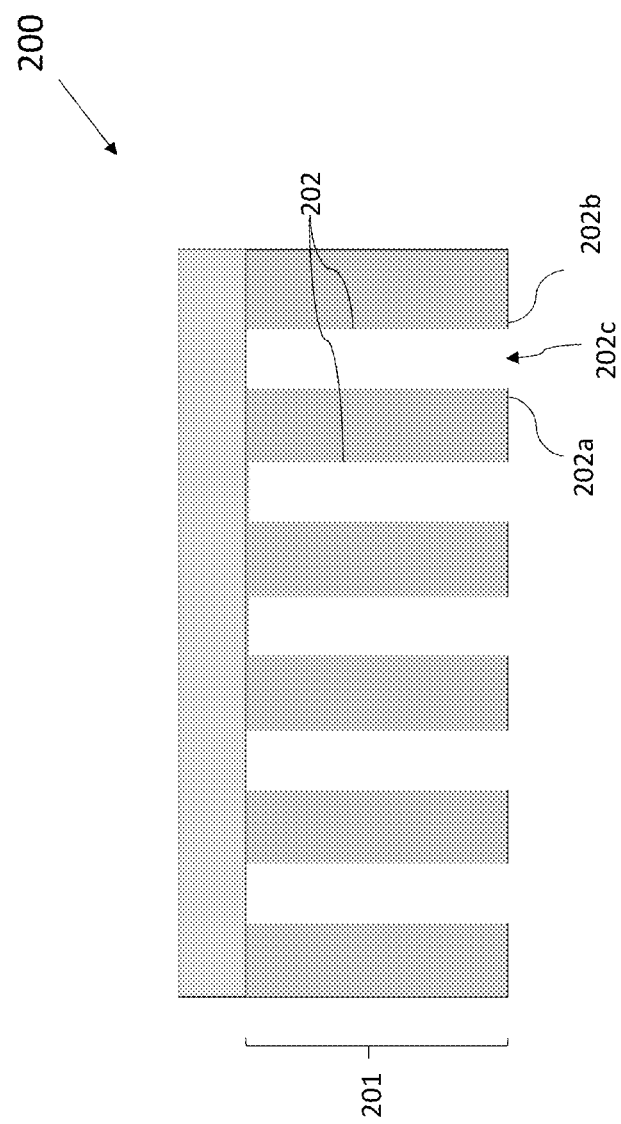
FIG. 2 shows a representative diagram of a set of trenches.

In FIG. 2, a representative example of a set of trenches having a high aspect ratio is shown according to the present disclosure. A specimen 200 may have a trench layer 201 with individual trenches 202. The trenches 202 may have an aspect ratio greater than 2.5. The trenches 202 may have an opening 202c that has adjacent top surfaces 202a and 202b. In an aspect, the openings 202c will be directed downward, which is the orientation used in the accompanying FIGS. 3, 4, 5, and 6.

Figure 3A:
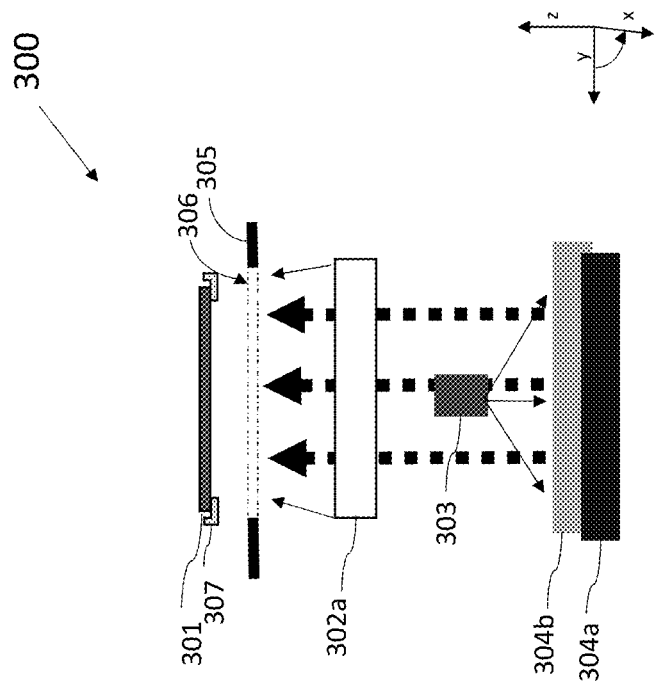
FIGS. 3 and 3A show different views of an exemplary semiconductor tool used for deposition according to an aspect of the present disclosure.
Figure 3:
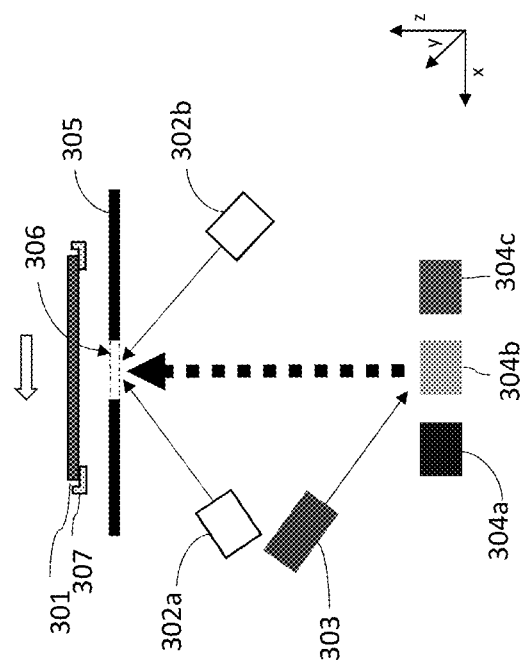

FIGS. 3 and 3A show different views of an exemplary semiconductor tool 300 that may be used for a deposition process step according to an aspect of the present disclosure. In FIG. 3, a first view shows a specimen 301 having trenches (not shown), similar to those shown in FIG. 2, that moves in an x-direction from right to left within the semiconductor tool 300. The specimen 301 may be a semiconductor wafer or panel positioned on a specimen support 307. The specimen 301 may be oriented in a face-down position by a mechanical inversion device, such as a robotic arm, rotatable specimen support/holder, etc. In this aspect, positioned below the specimen 301 may be ion beam guns 302a and 320b, an electron beam gun 303 and multiple sources/targets 304a, 304b, and 304c, which provide a same or different materials for deposition, e.g., metals, alloys, etc. The electron beam gum 303 may be movably directed to the source 304b to generate an atomic flux/plasma to deposit the source material onto the specimen 301. The ion beam guns 302a and 302b may be directed to the specimen 301 for the removal of any "excess" source material that may form obstructions, e.g., bread loafing, blocking the deposition of source material within a trench (not shown).

In another aspect, a slotted shield 305 may be positioned below the specimen 301 to selectively permit the passage of the atomic flux/plasma to the specimen 301 through a slot 306, i.e., collimating the flux. The ion beam guns 302a and 302b may direct their beams through the slot 306 to reach the specimen 301.

In FIG. 3A, the semiconductor tool 300 is shown from a second view that is rotated 90° from the first view in FIG. 3. In this aspect, the ion beam guns 302a (and not shown ion beam gun 302b) may provide a blade-shaped beam through a length-wise portion of the slot 306 to reach the specimen 301. The electron beam gun 303 may be movably directed to the source 304b, which may be a rectangular-shaped source having a length that may be approximately the same as a 300 mm diameter wafer.

In another aspect, according to the present disclosure, an electron beam gun may produce a deposition atomic flux/plasma with an energy level in the range of approximately 0.1 to 0.5 eV and a present semiconductor tool may operate in an Ar environment having a pressure in the range of approximately 0 to 1e-3 torr.

In a further aspect, the semiconductor tool 300, as well as the other versions of the present semiconductor tool described herein, may be coupled to a computing device or processor (not shown). The processor may be integrated with the semiconductor tool 300, a standalone unit, or a server (not shown) in a foundry computer network.

Figure 4A:
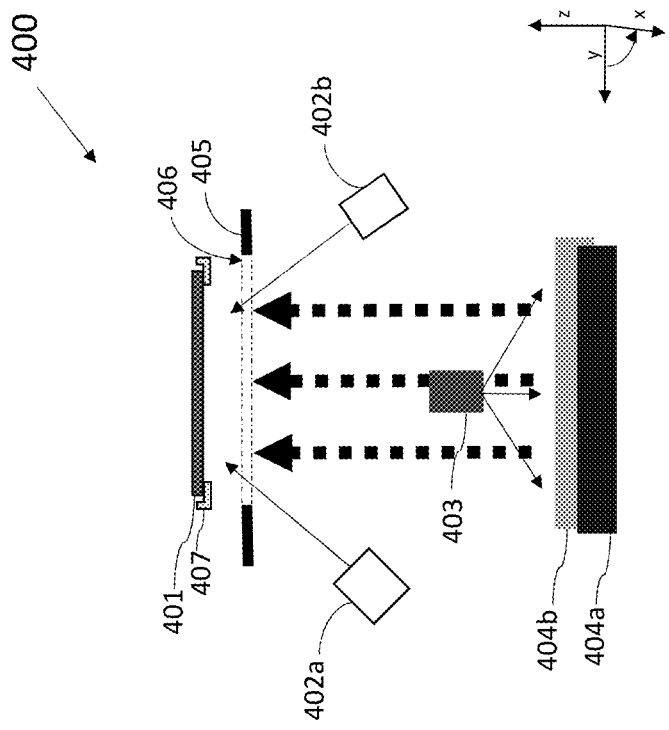
FIGS. 4 and 4A show different views of another exemplary semiconductor tool used for deposition according to another aspect of the present disclosure.
Figure 4:
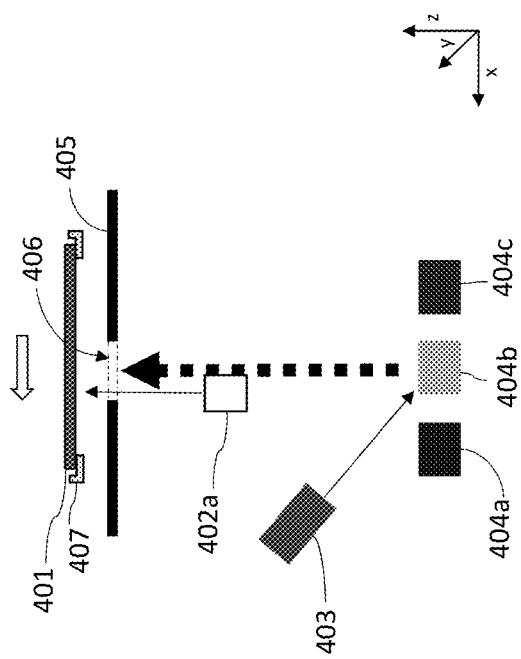

FIGS. 4 and 4A show different views of another exemplary semiconductor tool 400 that may be used for a deposition process step according to another aspect of the present disclosure. The features in FIGS. 4 and 4A may have identical and/or similar features as described with respect to FIGS. 3 and 3A above.

In FIG. 4, a first view shows a specimen 401 having trenches (not shown), similar to those shown in FIG. 2, that moves in an x-direction from right to left within the semiconductor tool 400. The specimen 401 may be a semiconductor wafer or panel positioned on a specimen support 407. The specimen 401 may be oriented in a face-down position by a mechanical inversion device, such as a robotic arm, rotatable specimen holder, etc. In this aspect, positioned below the specimen 401 may be ion beam guns 402a and 420b, an electron beam gun 403 and multiple sources/targets 404a, 404b, and 404c, which provide different deposition materials. The electron beam gun 403 may be movably directed to the source 404b to generate an atomic flux/plasma to deposit the source material onto the specimen 401. The ion beam gun 402a (and not shown ion beam gun 402b) may be directed to the specimen 401 for the removal of any "excess" source material that may form obstructions, e.g., bread loafing, blocking the deposition of source material within a trench (not shown).

In another aspect, a slotted shield 405 may be positioned below the specimen 401 to selectively permit the passage of the atomic flux/plasma to the specimen 401 through a slot 406, i.e., collimating the flux. The ion beam guns 402a and 402b may direct their beams through the slot 406 to reach the specimen 401 and may remove excess source material from features that have varying orientations.

Figure 5A:
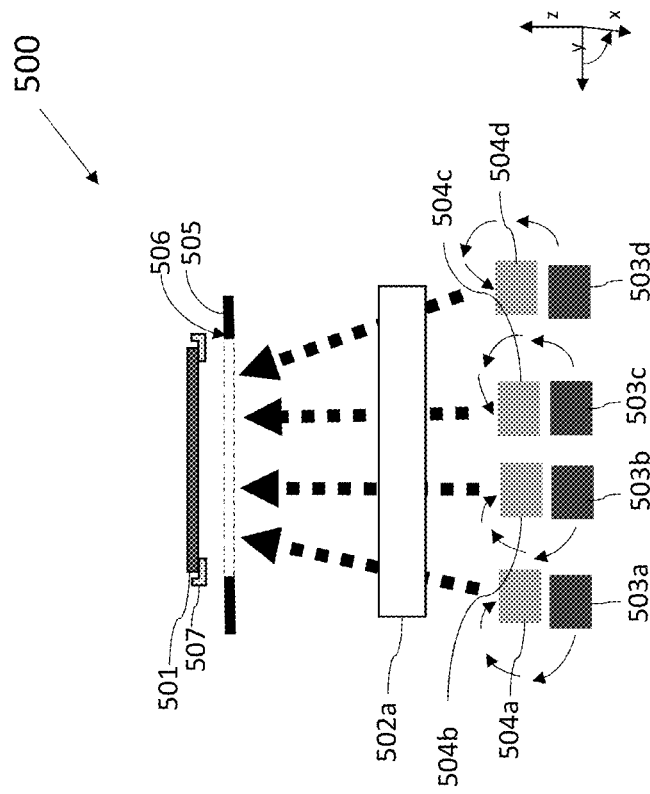
FIGS. 5 and 5A show different views of yet another exemplary semiconductor tool used for deposition according to yet another aspect of the present disclosure.
Figure 5:
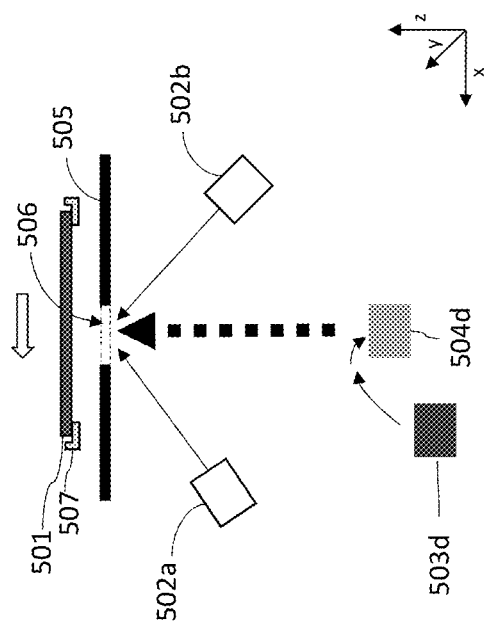

In FIG. 4A, the semiconductor tool 400 is shown from a second view that is rotated 90° from the first view in FIG. 4. In this aspect, the ion beam guns 402a and 402b may be movable and each gun provides a beam that swings through a length-wise portion of the slot 406 to reach the specimen 401. The electron beam gun 403 may be movably directed to the source 404b, which may be a rectangular-shaped source having a length that may be approximately the same as a 300 mm diameter wafer FIGS. 5 and 5A show different views of another exemplary semiconductor tool 500 that may be used for a deposition process step according to another aspect of the present disclosure. The features in FIGS. 5 and 5A may have identical and/or similar features as described with respect to FIGS. 3 and 3A above.

In FIG. 5, a first view shows a specimen 501 having trenches (not shown), similar to those shown in FIG. 2, that moves in an x-direction from right to left within the semiconductor tool 500. The specimen 501 may be a semiconductor wafer or panel positioned on a specimen support 507. The specimen 501 may be oriented in a face-down position by a mechanical inversion device, such as a robotic arm, rotatable specimen holder, etc. In this aspect, positioned below the specimen 501 may be ion beam guns 502a and 520b, a plurality of electron beam guns 503a, 503b, 503c, and 503d and multiple sources/targets 504a, 504b, 504c, and 504d, which provide the same or different deposition materials. As shown in FIG. 5, the electron beam gun 503b may provide a directed beam to the source 504b to generate an atomic flux/plasma to deposit the source material onto the specimen 501. The ion beam guns 502a and 502b may be directed to the specimen 501 for the removal of any "excess" source material that may form obstructions, e.g., bread loafing, blocking the deposition of source material within a trench (not shown).

In another aspect, a slotted shield 505 may be positioned below the specimen 501 to selectively permit the passage of the atomic flux/plasma to the specimen 501 through a slot 506, i.e., collimating the flux. The ion beam guns 502a and 502b may direct their beams through the slot 506 to reach the specimen 501.

In FIG. 5A, the semiconductor tool 500 is shown from a second view that is rotated 90° from the first view in FIG. 5. In this aspect, the ion beam gun 502a (and not shown ion beam gun 502b) may provide a blade-shaped beam through a length-wise portion of the slot 506 to reach the specimen 501. The plurality of electron beam guns 503a, 503b, 503c, and 503d, respectively, may be directed to the multiple sources/targets 504a, 504b, 504c, and 504d, which may be smaller circular or square-shaped sources that may generate an atomic flux/plasma suitable for deposition over a 300 mm diameter wafer.

Figure 6A:
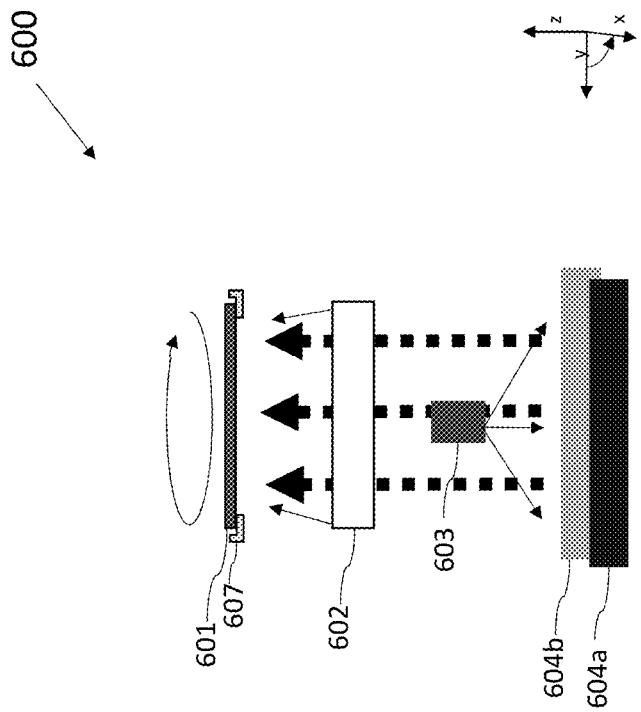
FIGS. 6 and 6A show different views of a further exemplary semiconductor tool used for deposition according to a further aspect of the present disclosure.
Figure 6:
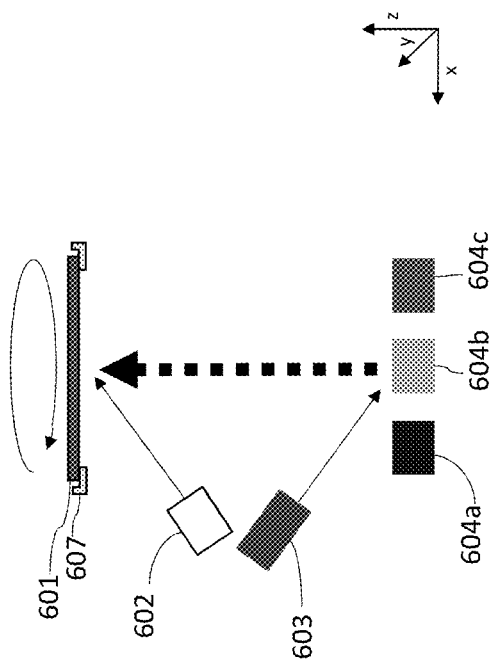

FIGS. 6 and 6A show different views of a further exemplary semiconductor tool used for a deposition process step according to a further aspect of the present disclosure. In FIG. 6, a first view shows a specimen 601 having trenches (not shown), similar to those shown in FIG. 2, that moves in a rotational motion within the semiconductor tool 600. The specimen 601 may be a semiconductor wafer or panel positioned on a specimen support 607. The specimen 601 may be oriented in a face-down position by a mechanical inversion device, such as a robotic arm, rotatable specimen holder, etc. In this aspect, positioned below the specimen 601 may be an ion beam gun 602, an electron beam gun 603 and multiple sources/targets 604a, 604b, and 604c, which provide a same or different materials for deposition, e.g., metals, alloys, etc. The electron beam gun 603 may be movably directed to the source 604b to generate an atomic flux/plasma to deposit the source material onto the specimen 601. In this aspect, there is no slotted shield required to be positioned below the specimen 601 and the atomic flux/plasma may deposit source material on the specimen 601. The ion beam gun 602 may be directed to the specimen 601 for the removal of any "excess" source material that may form obstructions, e.g., bread loafing, blocking the deposition of source material within a trench (not shown).

In FIG. 6A, the semiconductor tool 600 is shown from a second view that is rotated 90° from the first view in FIG. 6. In this aspect, the ion beam guns 602 may provide a blade-shaped beam that may be directed across the rotating specimen 601. The electron beam gun 603 may be movably directed to the source 604b, which may be a rectangular-shaped source having a length that may be approximately the same as a 300 mm diameter wafer.

Figure 7:
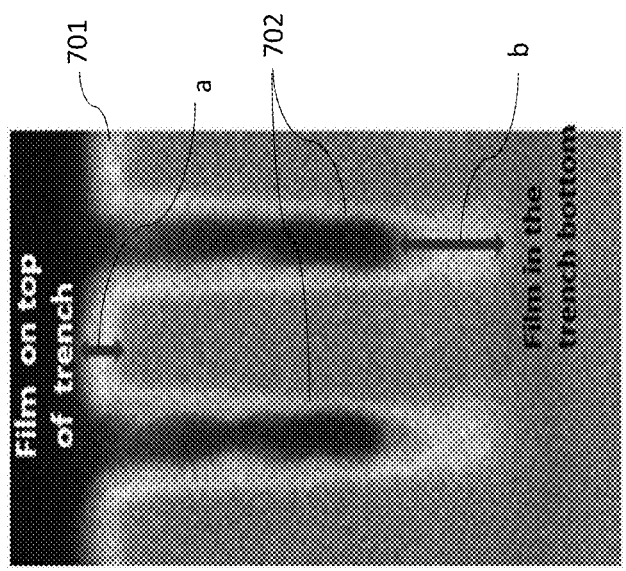
FIG. 7 shows an image of a trench that is provided with a layer of source material according to an aspect of the present disclosure.

FIG. 7 shows an image of a trench that is provided with a layer of source material according to an aspect of the present disclosure. In FIG. 7, a pair of trenches 702 have a layer of source material 701 that has been deposited by a present tool and method. The layer 701 has a portion at a top surface between the trenches 702 that has a thickness "a" and a portion at a bottom surface of the trench that has a thickness "b" that is larger. Unlike the results obtained through the use of conventional tools and methods, the increased thickness "b" at the bottom surface of the trench is an advantageous result that may be obtained by the present disclosure.

Figure 8:
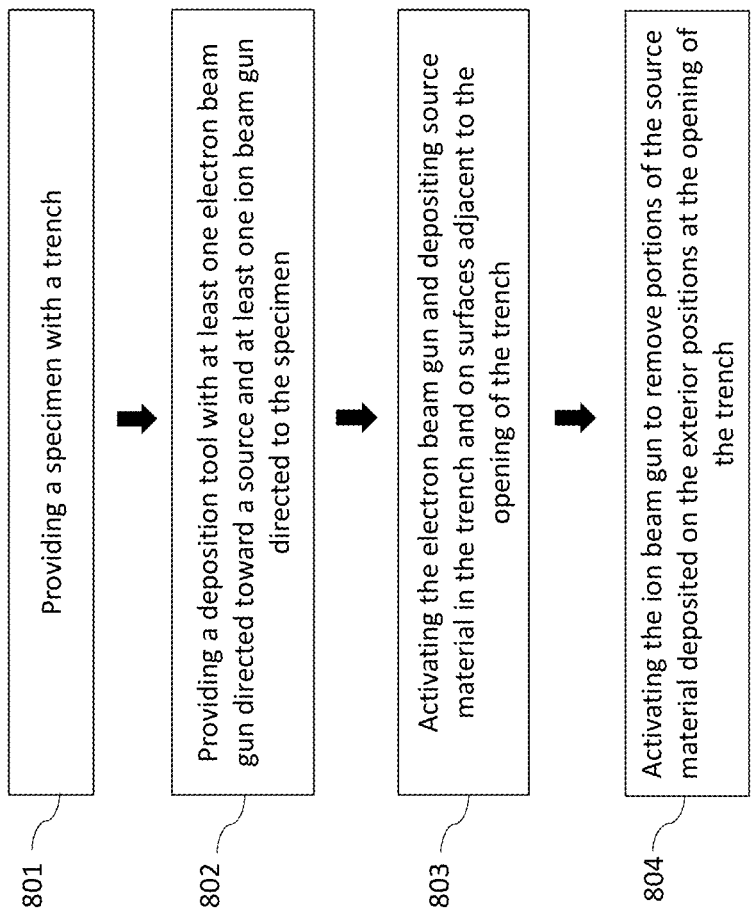
FIG. 8 shows a simplified flow diagram for an exemplary method according to an aspect of the present disclosure.

FIG. 8 shows a simplified flow diagram for an exemplary method for wafer inspection according to an aspect of the present disclosure.

The operation 801 may be directed to providing a specimen with a trench.

The operation 802 may be directed to providing a deposition tool with at least one electron beam gun directed toward a source and at least one ion beam gun directed to the specimen.

The operation 803 may be directed to activating the electron beam gun and depositing source material in the trench and on surfaces adjacent to the opening of the trench.

The operation 804 may be directed to activating the ion beam gun to remove portions of the source material deposited on the exterior positions at the opening of the trench.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present metrology system and methods for their use in gap measurements, they will now be described by way of examples. For the sake of brevity, duplicate descriptions of features and properties may be omitted.

EXAMPLES

Example 1 provides a semiconductor tool including a specimen support, at least one ion gun, for which the ion gun is directed to a specimen positioned on the specimen support, at least one source, and at least one electron gun, for which the electron gun is directed at the source.

Example 2 may include the semiconductor tool of example 1 and/or any other example disclosed herein, for which the electron gun, source, and ion gun are positioned below the specimen support and the specimen is positioned with its top surface facing downward.

Example 3 may include the semiconductor tool of example 1 and/or any other example disclosed herein, further including a shield with a slot-shaped opening, for which the shield is positioned between the specimen support and the source.

Example 4 may include the semiconductor tool of example 3 and/or any other example disclosed herein, for which the specimen support is configured to move the specimen orthogonally across a long side of the slot-shaped opening.

Example 5 may include the semiconductor tool of example 1 and/or any other example disclosed herein, for which the specimen support is configured to rotate the specimen.

Example 6 may include the semiconductor tool of example 1 and/or any other example disclosed herein, for which the ion gun and electron gun are configured to operate simultaneously or in series.

Example 7 may include the semiconductor tool of example 1 and/or any other example disclosed herein, for which the at least one ion gun further includes two ion guns, for which each ion gun is positioned on a diagonal facing the specimen.

Example 8 may include the semiconductor tool of example 1 and/or any other example disclosed herein, for which the at least one electron beam gun further includes two electron beam guns, for which each electron beam gun is directed to a different source.

Example 9 may include the semiconductor tool of example 1 and/or any other example disclosed herein, for which the electron beam gun is configured to produce a deposition flux with an energy level in the range of approximately 0.1 to 0.5 eV.

Example 10 may include the semiconductor tool of example 1 and/or any other example disclosed herein, further including an Ar environment having a pressure in the range of approximately 0 to 1e-3 torr.

Example 11 may include the semiconductor tool of example 1 and/or any other example disclosed herein, for which the at least one source further including a plural number of sources to produce an alloy.

Example 12 provides a semiconductor die including a trench having an aspect ratio greater than 2.5, a trench-fill material in the trench, for which the trench-fill material is deposited by electron beam deposition that is assisted by removal of obstructions at the trench using one or more ion beams.

Example 13 may include the semiconductor die of example 12 and/or any other example disclosed herein, for which the trench-fill material deposited at a bottom surface of the trench is thicker than at sidewall surfaces of the trench.

Example 14 provides a method that includes providing a specimen with a trench on an upper surface, for which the trench includes an opening, sidewall surfaces, and a bottom surface, providing at least one electron beam gun directed at a source to generate a plasma of source material, providing at least one ion beam gun directed at the surfaces surrounding the opening of the trench, activating the electron beam gun and depositing the source material on the specimen, for which the source material is deposited in the trench and on surfaces adjacent to the opening of the trench, and activating the ion beam gun to remove portions of the source material deposited on the surfaces adjacent to the opening of the trench.

Example 15 may include the method of example 14 and/or any other example disclosed herein, for which the specimen is inverted and positioned with its upper surfacing facing downward.

Example 16 may include the method of example 15 and/or any other example disclosed herein, further including positioning the specimen on a laterally moving specimen support.

Example 17 may include the method of example 15 and/or any other example disclosed herein, further including positioning the specimen on a rotating specimen support.

Example 18 may include the method of example 14 and/or any other example disclosed herein, further including activating the electron beam gun and ion beam gun simultaneously or in series.

Example 19 may include the method of example 14 and/or any other example disclosed herein, for which the at least one electron beam gun further including two electron beam guns and directing each electron beam gun to a different source.

Example 20 may include the method of example 14 and/or any other example disclosed herein, for which the at least one ion beam gun further includes two ion beam guns, and directing each ion beam gun to a surface adjacent to the opening of the trench.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:
1. A semiconductor tool comprising:
a specimen support;
at least one ion gun, wherein the ion gun is directed to a specimen positioned on the specimen support;
at least one source;
at least one electron gun, wherein the electron gun is directed at the source; and a shield with a slot-shaped opening, wherein the shield is positioned between the specimen support and the source.

2. The semiconductor tool of claim 1, wherein the electron gun, source, and ion gun are positioned below the specimen support and the specimen is positioned with its top surface facing downward.

3. The semiconductor tool of claim 1, wherein the specimen support is configured to move the specimen orthogonally across a long side of the slot-shaped opening.

4. The semiconductor tool of claim 1, wherein the specimen support is configured to rotate the specimen.

5. The semiconductor tool of claim 1, wherein the ion gun and electron gun are configured to operate simultaneously or in series.

6. The semiconductor tool of claim 1, wherein the at least one ion gun further comprises two ion guns, wherein each ion gun is positioned on a diagonal facing the specimen.

7. The semiconductor tool of claim 1, wherein the at least one electron beam gun further comprises two electron beam guns, wherein each electron beam gun is directed to a different source.

8. The semiconductor tool of claim 1, wherein the electron beam gun is configured to produce a deposition flux with an energy level in the range of approximately 0.1 to 0.5 eV.

9. The semiconductor tool of claim 1, further comprising an argon (Ar) environment having a pressure in the range of approximately 0 to 1e-3 torr.

10. The semiconductor tool of claim 1, wherein the at least one source further comprising a plural number of sources to produce an alloy.

11. A semiconductor die comprising:
a trench having an aspect ratio greater than 2.5; and
a trench-fill material in the trench, wherein the trench-fill material is deposited by electron beam deposition that is assisted by removal of obstructions at the trench using one or more ion beams.

12. The semiconductor die of claim 11, wherein the trench-fill material deposited at a bottom surface of the trench is thicker than at sidewall surfaces of the trench.

13. A method comprising:
providing a specimen with a trench on an upper surface, wherein the trench comprises an opening, sidewall surfaces, and a bottom surface;
providing at least one electron beam gun directed at a source to generate a plasma of source material;
providing at least one ion beam gun directed at the surfaces surrounding the opening of the trench;
providing a shield with a slot-shaped opening positioned between the specimen and the source;
activating the electron beam gun and depositing the source material on the specimen, wherein the source material is deposited in the trench and on surfaces adjacent to the opening of the trench; and
activating the ion beam gun to remove portions of the source material deposited on the surfaces adjacent to the opening of the trench.

14. The method of claim 13, wherein the specimen is inverted and positioned with its upper surfacing facing downward.

15. The method of claim 14, further comprising positioning the specimen on a laterally moving specimen support.

16. The method of claim 14, further comprising positioning the specimen on a rotating specimen support.

17. The method of claim 13, further comprising activating the electron beam gun and ion beam gun simultaneously or in series.

18. The method of claim 13, wherein the at least one electron beam gun further comprises two electron beam guns and directing each electron beam gun to a different source.

19. The method of claim 15, wherein the at least one ion beam gun further comprises two ion beam guns and directing each ion beam gun to a surface adjacent to the opening of the trench.

* * * * *